(12) United States Patent
Kinuta et al.

(10) Patent No.: US 12,068,150 B2
(45) Date of Patent: Aug. 20, 2024

(54) SUBSTRATE CLEANING SOLUTION, AND USING THE SAME, METHOD FOR MANUFACTURING CLEANED SUBSTRATE AND METHOD FOR MANUFACTURING DEVICE

(71) Applicant: Merck Patent GmbH, Darmstadt (DE)

(72) Inventors: Takafumi Kinuta, Kakegawa (JP); Tatsuro Nagahara, Kakegawa (JP); Yuko Horiba, Kakegawa (JP)

(73) Assignee: Merck Patent GmbH, Darmstadt (DE)

( * ) Notice: Subject to any disclaimer, the term of this patent is extended or adjusted under 35 U.S.C. 154(b) by 316 days.

(21) Appl. No.: 17/312,829

(22) PCT Filed: Dec. 12, 2019

(86) PCT No.: PCT/EP2019/084873
§ 371 (c)(1),
(2) Date: Jun. 10, 2021

(87) PCT Pub. No.: WO2020/120667
PCT Pub. Date: Jun. 18, 2020

(65) Prior Publication Data
US 2022/0059344 A1    Feb. 24, 2022

(30) Foreign Application Priority Data
Dec. 14, 2018  (JP) ................... 2018-234040

(51) Int. Cl.
*H01L 21/02*    (2006.01)
*C11D 7/50*     (2006.01)
*H01L 21/461*   (2006.01)

(52) U.S. Cl.
CPC ...... *H01L 21/02052* (2013.01); *C11D 7/5004* (2013.01); *H01L 21/02057* (2013.01); *H01L 21/461* (2013.01); *C11D 2111/22* (2024.01)

(58) Field of Classification Search
CPC ......... H01L 21/02052; H01L 21/02057; H01L 21/21461; C11D 7/5004; C11D 11/0047
See application file for complete search history.

(56) References Cited

U.S. PATENT DOCUMENTS

2014/0144465 A1* 5/2014 Kaneko ............ H01L 21/67051
                                                            134/4
2016/0032227 A1* 2/2016 Mochida ............... C08F 132/08
                                                            510/175
(Continued)

FOREIGN PATENT DOCUMENTS

EP    3576133 A1    12/2019
EP    3576134 A1    12/2019
(Continued)

OTHER PUBLICATIONS

Machine Translation of WO2018/190278 (Year: 2018).*
(Continued)

*Primary Examiner* — Sharidan Carrillo
(74) *Attorney, Agent, or Firm* — Faegre Drinker Biddle & Reath LLP

(57) ABSTRACT

[Problem] To obtain a substrate cleaning solution capable of cleaning a substrate and removing particles.
[Means for Solution] The present invention is a substrate cleaning solution comprising an insoluble or hardly soluble solute (A), a soluble solute (B), and a solvent (C).

17 Claims, 1 Drawing Sheet

(56) References Cited

U.S. PATENT DOCUMENTS

| | | | | |
|---|---|---|---|---|
| 2016/0035564 A1* | 2/2016 | Aibara | ............... | H01L 21/6715 |
| | | | | 134/4 |
| 2017/0345685 A1* | 11/2017 | Sekiguchi | ......... | H01L 21/67051 |
| 2018/0211828 A1 | 7/2018 | Chung et al. | | |
| 2019/0366394 A1* | 12/2019 | Yoshida | ............ | H01L 21/67051 |
| 2019/0371599 A1* | 12/2019 | Yoshida | .............. | H01L 21/6715 |
| 2020/0040282 A1* | 2/2020 | Aoki | .................... | C11D 3/3703 |
| 2020/0086360 A1 | 3/2020 | Yoshida et al. | | |

FOREIGN PATENT DOCUMENTS

| | | | | |
|---|---|---|---|---|
| EP | 3667703 A1 * | 6/2020 | .............. | B08B 3/10 |
| JP | 2014-197717 A | 10/2014 | | |
| JP | 2016-034006 A | 3/2016 | | |
| JP | 2018-110220 A | 7/2018 | | |
| KR | 10-2011-0093995 A | 8/2011 | | |
| WO | 2018/190278 A1 | 10/2018 | | |

OTHER PUBLICATIONS

International Search Report and Written Opinion received for PCT Patent Application No. PCT/EP19/084873, mailed on Apr. 8, 2020, 10 pages.

International Preliminary Report on Patentability received for PCT Patent Application No. PCT/EP2019/084873, mailed on Jun. 24, 2021, 8 pages.

* cited by examiner (a) 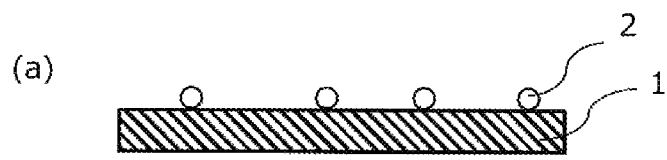
(b) 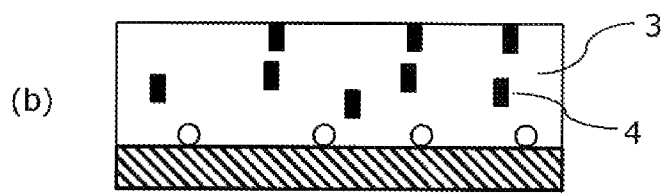
(c) 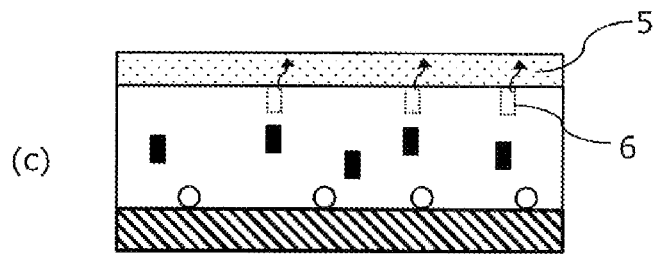
(d) 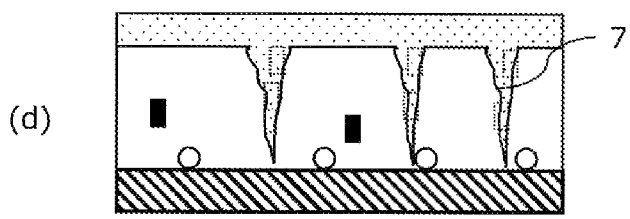
(e) 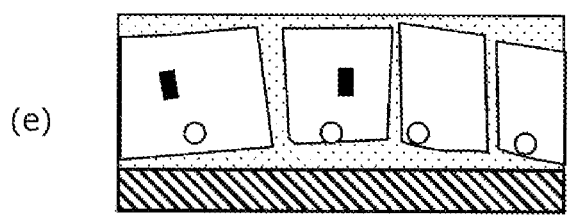
(f) 

SUBSTRATE CLEANING SOLUTION, AND USING THE SAME, METHOD FOR MANUFACTURING CLEANED SUBSTRATE AND METHOD FOR MANUFACTURING DEVICE

CROSS-REFERENCE TO RELATED APPLICATIONS

This application is a national stage application (under 35 U.S.C. § 371) of PCT/EP2019/084873, filed Dec. 12, 2019, which claims benefit of Japanese Application No. 2018-234040, filed Dec. 14, 2018, both of which are incorporated herein by reference in their entirety.

BACKGROUND OF THE INVENTION

Technical Field

The present invention relates to a substrate cleaning solution for cleaning a substrate and a method for cleaning a substrate using the same.

BACKGROUND ART

Conventionally, in the process of manufacturing a substrate, debris may be generated, for example, by a lithography process or the like. Therefore, the substrate manufacturing process may include a cleaning step for removing particles on the substrate. In the cleaning step, there are methods such as a method for physically removing particles by supplying a cleaning solution such as deionized water (DIW) on the substrate and a method for chemically removing particles with chemicals. However, as patterns become finer and more complicated, they become more susceptible to physical or chemical damage.

In addition, as a substrate cleaning step, there is a method for forming a film on a substrate to remove particles.

Patent Document 1 studies a substrate cleaning composition in which polymer having a special partial structure that essentially contains fluorine is used for forming a film, in order to obtain an affinity to a stripping solution and a dissolution rate.

Patent Document 2 studies a substrate cleaning apparatus which completely dissolves and removes a film formed by solidifying or curing a processing liquid on a substrate with a remover.

Patent document 3 studies a substrate cleaning apparatus which removes a film (particle holding layer) from a substrate by dissolving in a remover a solvent which remains in a particle holding layer.

PRIOR ART DOCUMENTS

Patent Documents

[Patent document 1] JP-A 2016-34006
[Patent document 2] JP-A 2014-197717
[Patent document 3] JP-A 2018-110220

SUMMARY OF THE INVENTION

Problems to be Solved by the Invention

The inventors considered that in the technology of forming a film on a substrate to remove particles, one or more problems still need to be improved. They include, for example, the followings: removal of particles is insufficient; films are not formed uniformly and particles remain; films formed do not peel off from the substrate; films formed are not removed sufficiently and they become solid waste; when it is attempted to use a material having fluorine or the like, the synthesis becomes complicated; there is no portion in the film which becomes a trigger that the formed film peels; the held particles are detached and reattached on the substrate due to complete dissolution of a film; and process control is required to leave the organic solvent in the film. The present invention has been made based on the technical background as described above and provides a substrate cleaning solution.

Means for Solving the Problems

The substrate cleaning solution according to the present invention comprises an insoluble or hardly soluble solute (A), a soluble solute (B), and a solvent (C). Here, it is characterized in that the substrate cleaning solution is dripped on a substrate and dried to remove the solvent (C), and filmed insoluble or hardly soluble solute (A) together with the soluble solute (B) remains in the film on the substrate, the film being then removed from the substrate by a remover. Preferably, the insoluble or hardly soluble solute (A) is insoluble or hardly insoluble in the remover. Preferably, the soluble solute (B) is soluble in the remover. The present invention also provides a method for manufacturing a cleaned substrate comprising the following steps:
(1) dripping the substrate cleaning solution of the present invention on a substrate;
(2) removing the solvent (C), and filmed insoluble or hardly soluble solute (A) together with the soluble solute (B) remains in the film on the substrate;
(3) making the film hold particles on the substrate; and
(4) applying a remover on the substrate to remove the film holding particles.

Further, the present invention provides a device manufacturing method, comprising the method for manufacturing a cleaned substrate of the present invention.

Effects of the Invention

Using the substrate cleaning solution of the present invention, it is possible to desire one or more of the following effects. It is possible to sufficiently remove particles; it is possible to form a film uniformly and to reduce the remaining amount of particles; it is possible to sufficiently peel off the formed film from the substrate and to remove it; there is no need to use materials having fluorine or the like, whose synthesis is complicated; since there is a portion, which becomes a trigger that the film peels, in the film, it is possible to sufficiently remove the film; since there is no need to dissolve most of the film to remove, it is possible to prevent the detachment of the held particles; and it is possible to make unnecessary the process control for leaving the organic solvent in the film.

BRIEF DESCRIPTION OF THE DRAWINGS

FIG. 1 is a cross section that schematically illustrates the appearance of a substrate surface in the substrate cleaning according to the present invention.

DETAILED DESCRIPTION OF THE INVENTION

Mode for Carrying Out the Invention

The above summary and the following details are intended to explain the present invention and not to limit the claimed invention.

In the present specification, unless otherwise specifically mentioned, the singular includes the plural and "one" or "that" means "at least one". In the present specification, unless otherwise specifically mentioned, an element of a concept can be expressed by a plurality of species, and when the amount (for example, mass % or mol %) is described, it means sum of the plurality of species.

"And/or" includes a combination of all elements and also includes single use of the element.

In the present specification, when a numerical range is indicated using "to" or "-", unless otherwise specifically mentioned, it includes both endpoints and units thereof are common. For example, 5 to 25 mol % means 5 mol % or more and 25 mol % or less.

In the present specification, the descriptions such as "$C_{x-y}$", "$C_x$-$C_y$" and "$C_x$" mean the number of carbons in a molecule or substituent. For example, $C_{1-6}$ alkyl means an alkyl chain having 1 or more and 6 or less carbons (methyl, ethyl, propyl, butyl, pentyl, hexyl etc.).

In the present specification, when polymer has a plural types of repeating units, these repeating units copolymerize. Unless otherwise specifically mentioned, these copolymerization may be any of alternating copolymerization, random copolymerization, block copolymerization, graft copolymerization, or a mixture thereof. When polymer or resin is represented by a structural formula, n, m or the like that is attached next to parentheses indicate the number of repetitions.

In the present specification, unless otherwise specifically mentioned, Celsius is used as the temperature unit. For example, 20 degrees means 20 degrees Celsius.

<Substrate cleaning solution>

The substrate cleaning solution according to the present invention comprises an insoluble or hardly soluble solute (A), a soluble solute (B), and a solvent (C). Here, the substrate cleaning solution is dripped on a substrate and dried to remove the solvent (C), and filmed insoluble or hardly soluble solute (A) together with the soluble solute (B) remains in the film on the substrate, and the film being then removed from the substrate by a remover. Preferably, the insoluble or hardly soluble solute (A) is insoluble or hardly insoluble in the remover. Further, preferably, the soluble solute (B) is soluble in the remover. The above "solute" is not limited to the state of being dissolved in the solvent (C), and a suspended state thereof is also accepted. In a preferred embodiment of the present invention, the solutes, components and additives contained in the substrate cleaning solution are soluble in the solvent (C). The substrate cleaning solution in this embodiment is considered to have good embedding properties or film uniformity.

Here, ". . . together with . . . in the film" means preferably to be in a state of coexistence in one film, but not to form separate layers. One embodiment of "filmed" is "solidified". Furthermore, it is enough that the film obtained from the substrate cleaning solution has a hardness to the extent to hold particles, and the solvent (C) is not required to be completely removed (for example, through vaporization). The substrate cleaning solution becomes a film while gradually shrinking as the solvent (C) vaporizes. As for the "remains in the film on the substrate", it is accepted that an extremely small amount is removed (for example, vaporization, volatilization) in comparison with the whole. For example, it is accepted that 0-10 mass % (preferably 0-5 mass %, more preferably 0-3 mass %, further preferably 0-1 mass %, and still more preferably 0-0.5 mass %) relative to the original amount is removed.

Although this is not intended to limit the scope of the invention and not to be bound by theory, it is considered that the film holds particles on the substrate and is removed by being peeled off by a remover that is described later. Further, since the soluble solute (B) remains in the film, it is considered that a portion which becomes a trigger that the film peels is generated.

<Insoluble or Hardly Soluble Solute>

The substrate cleaning solution according to the present invention comprises an insoluble or hardly soluble solute (A).

The insoluble or hardly soluble solute (A) comprises at least one of novolak, polyhydroxy styrene, polystyrene, polyacrylate derivatives, polymaleic acid derivatives, polycarbonate, polyvinyl alcohol derivatives, polymethacrylate derivatives, and copolymer of any combination of any of these. Preferably, the insoluble or hardly soluble solute (A) comprises at least one of novolak, polyhydroxystyrene, polyacrylic acid derivatives, polycarbonate, polymethacrylic acid derivatives, and copolymer of any combination of any of these. More preferably, the insoluble or hardly soluble solute (A) comprises at least one of novolak, polyhydrostyrene, polycarbonate, and copolymer of any combination of any of these. Novolac may be phenol novolac.

It is described for clarity that the substrate cleaning solution according to the present invention may comprise one or more of the above-mentioned preferred examples in combination as the insoluble or hardly soluble solute (A). For example, the insoluble or hardly soluble solute (A) may contain both novolak and polyhydroxystyrene.

It is a preferable embodiment of the present invention that the insoluble or hardly soluble solute (A) is dried to form a film, and the film is peeled off while holding particles without being mostly dissolved by the below-mentioned remover. In addition, the embodiment in which a very few portions of the insoluble or hardly soluble solute (A) is dissolved by the remover is accepted.

Preferably, the insoluble or hardly soluble solute (A) does not contain fluorine and/or silicon, and more preferably, it contains neither of them.

The above-mentioned copolymerization is preferably random copolymerization or block copolymerization.

Although it is not intended to limit the present invention, exemplified examples of the insoluble or hardly soluble solute (A) include the followings:

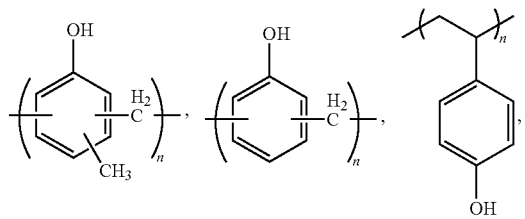

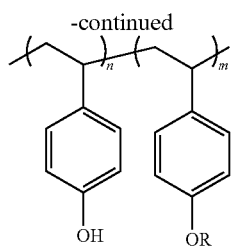

R represents a substituent such as a $C_{1-4}$ alkyl,

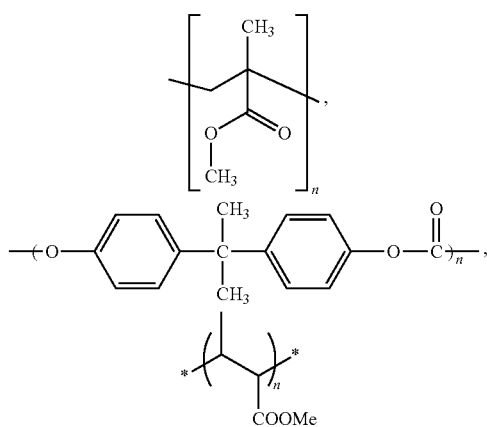

The weight-average molecular weight ($M_w$) of the insoluble or hardly soluble solute (A) is 150-500,000, more preferably 300-300,000, further preferably 500-100,000, and still more preferably 1,000-50,000.

The insoluble or hardly soluble solute (A) can be obtained through synthesis thereof. It is also possible to purchase it. When purchasing, examples of the supplier are indicated below. It is also possible that the supplier synthesizes polymer (A) so as to make the effects of the present invention be exhibited.

novolak: Showa Kasei Kogyo Co., Ltd., Asahi Yukizai Corporation, Gunei Chemical Industry Co., Ltd., Sumitomo Bakelite Co., Ltd.

polyhydroxystyrene: Nippon Soda Co., Ltd., Maruzen Petrochemical Co., Ltd., Toho Chemical Industry Co., Ltd.

polyacrylic acid derivatives: Nippon Shokubai Co., Ltd.

polycarbonate: Sigma-Aldrich polymethacrylic acid derivatives: Sigma-Aldrich

In one embodiment of the present invention, compared with the total mass of the substrate cleaning solution, the content of the insoluble or hardly soluble solute (A) is 0.1-50 mass %, preferably 0.5-30 mass %, more preferably 1-20 mass %, and further preferably 1-mass %. That is, it is one embodiment of the present invention that when the total mass of the substrate cleaning solution is made 100 mass %, the insoluble or hardly soluble solute (A) is 0.1-50 mass % based on this. That is, "compared with" can be reworded into "based on". Unless otherwise stated, the same is in the present specification.

The solubility can be evaluated by known methods. For example, it can be determined under the condition of 20-35° C. (more preferably 25±2° C.) by providing a flask charged with 100 ppm of the above (A) or the below-mentioned (B) in 5.0 mass % ammonia water, covering the flask with a cap, shaking for 3 hours in a shaker, and confirming whether (A) or (B) is dissolved or not. The shaking may be stirring. Dissolution can be also judged visually. If it is not dissolved, the solubility is determined to be less than 100 ppm, and if it is dissolved, the solubility is determined to be 100 ppm or more. In the present specification, the solubility of less than 100 ppm is determined to be insoluble or hardly soluble, and the solubility of 100 ppm or more is determined to be soluble. In the present specification, soluble includes slightly soluble in a broad sense. In the present specification, the solubility becomes low in the order of insoluble, hardly soluble and soluble. In the present specification, slightly soluble is less soluble than soluble and more soluble than hardly soluble in a narrow sense.

The 5.0 mass % ammonia water may be changed to a remover (described later) that is used in a later process. The liquid to be used in the solubility evaluation and the remover do not have to be identical, and the coexistence of components having different solubilities is considered to be one point for exhibiting the effects of the present invention. A preferred embodiment of the present invention is an embodiment in which the soluble solute (B) present in the film formed from the substrate cleaning solution is dissolved by the remover to give a trigger that the film peels. Therefore, if a portion of the soluble solute (B) can be dissolved by the remover, it is considered that the effects of the present invention can be expected. Therefore, for example, even if the remover is weaker in alkalinity than the liquid used in the solubility evaluation, it is considered that the effects of the present invention are exhibited.

<Soluble Solute>

The substrate cleaning solution according to the present invention comprises a soluble solute (B). Preferably, the soluble solute (B) is a crack accelerating component (B'), where the crack accelerating component (B') comprises hydrocarbon and further comprises a hydroxy group (—OH) and/or a carbonyl group (—C(=O)—). When the crack accelerating component (B') is polymer, one kind of the structural unit comprises hydrocarbon in each unit and further has a hydroxy group and/or a carbonyl group. The carbonyl group includes carboxylic acid (—COOH), aldehyde, ketone, ester, amide and enone, and carboxylic acid is preferred.

Although this is not intended to limit the scope of the invention and not to be bound by theory, it is considered that the substrate cleaning solution is dried to form a film on the substrate, and when the remover peels off the film, the soluble solute (B) generates a portion to become a trigger that the film peels. For this purpose, it is preferable that the soluble solute (B) has a higher solubility in the remover than the insoluble or hardly soluble solute (A). As an embodiment in which the crack accelerating component (B') contains ketone as carbonyl group, a cyclic hydrocarbon is mentioned. Exemplified examples thereof include 1,2-cyclohexanedione and 1,3-cyclohexanedione.

In a more particular embodiment, the soluble solute (B) is represented by at least one of the formulae (B-1), (B-2), and (B-3):

(B-1) is a compound comprising 1 to 6 (preferably 1 to 4) structural units, wherein the structural unit is represented by the formula (B-1)' and each structural unit is bonded via a linker $L_1$,

(B-1)' wherein, $L_1$ is selected from at least one of a single bond and $C_{1-6}$ alkylene. The $C_{1-6}$ alkylene links structural units as a linker and is not limited to a divalent group. Preferably, it is divalent to tetravalent. The $C_{1-6}$ alkylene may be either of linear or branched. $L_9$ is preferably a single bond, methylene, ethylene or propylene.

$Cy_1$ is a $C_{5-30}$ hydrocarbon ring, preferably phenyl, cyclohexane or naphthyl, and more preferably phenyl. In a preferred embodiment, the linker $L_1$ links a plurality of $Cy_1$.

$R_1$ is each independently $C_{1-5}$ alkyl, preferably methyl, ethyl, propyl or butyl. The $C_{1-5}$ alkyl may be either of linear or branched.

$n_{b1}$ is 1, 2, or 3, preferably 1 or 2, and more preferably 1.

$n_{b1'}$ is 0, 1, 2, 3, or 4, preferably 0, 1 or 2.

Although there is no intention to limit the present invention, preferred examples of (B-1) include 2,2-bis(4-hydroxyphenyl)propane, 2,2'-methylenebis (4-methylphenol), 2,6-bis[(2-hydroxy-5-methylphenyl) methyl]-4-methylphenol, 1,3-cyclohexanediol, 4,4'-dihydroxybiphenyl, 2,6-naphthalenediol, 2,5-di-tert-butyl hydroquinone and 1,1,2,2-tetrakis (4-hydroxyphenyl)ethane. These may be obtained by polymerization or condensation.

2,6-bis[(2-hydroxy-5-methylphenyl)methyl]-4-methylphenol is given as an example for explanation. In (B-1), the compound has three structural units (B-1)', and the structural units are linked by $L_1$ (methylene). $n_{b1}=n_{b1'}=1$, and $R_1$ is methyl.

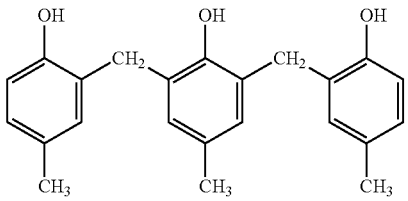

(B-2) is represented by the following formula.

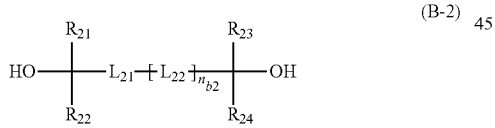

(B-2)

wherein, $R_{21}$, $R_{22}$, $R_{23}$, and $R_{24}$ are each independently hydrogen or a $C_{1-5}$ alkyl, preferably hydrogen, methyl, ethyl, t-butyl or isopropyl, more preferably hydrogen, methyl or ethyl, and further preferably methyl or ethyl.

$L_{21}$ and $L_{22}$ are each independently a $C_{1-20}$ alkylene, a $C_{1-20}$ cycloalkylene, a $C_{2-4}$ alkenylene, a $C_{2-4}$ alkynylene or a $C_{6-20}$ arylene. These groups may be substituted by a $C_{1-5}$ alkyl or hydroxy. Here, alkenylene means a divalent hydrocarbon having one or more double bonds, and alkynylene means a divalent hydrocarbon group having one or more triple bonds. $L_{21}$ and $L_{22}$ are preferably a $C_{2-4}$ alkylene, acetylene ($C_2$ alkynylene) or phenylene, more preferably a $C_{2-4}$ alkylene or acetylene, and further preferably acetylene.

$n_{b2}$ is 0, 1, or 2, preferably 0 or 1, and more preferably 0.

Although there is no intention to limit the present invention, preferred examples of (B-2) include 3,6-dimethyl-4-octin-3,6-diol and 2,5-dimethyl-3-hexyne-2,5-diol. As another embodiment, preferable examples of (B-2) also include 3-hexyne-2,5-diol, 1,4-butynediol, 2,4-hexadiyne-1,6-diol, 1,4-butanediol, cis-1,4-dihydroxy-2-butene and 1,4-benzenedimethanol.

(B-3) is polymer comprising a structural unit represented by the formula (B-3)' and having the weight-average molecular weight ($M_w$) of 500-10,000. The $M_w$ is preferably 600-5,000, and more preferably 700-3,000.

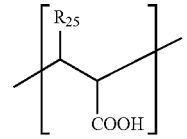

(B-3)' wherein, $R_{25}$ is —H, —$CH_3$ or —COOH, preferably —H or —COOH. It is also accepted that one polymer (B-3) comprises two or more structural units each represented by (B-3)'.

Although there is no intention to limit the present invention, preferred examples of polymer (B-3) include polymer of acrylic acid, maleic acid, acrylic acid, or any combination of any of these. Polyacrylic acid, and copolymer of maleic acid and acrylic acid are further preferred examples.

In the case of copolymerization, it is preferably random copolymerization or block copolymerization, and more preferably random copolymerization.

Copolymer of maleic acid and acrylic acid is given as an example for explanation. The copolymer is contained in (B-3) and has two structural units (B-3)', and in one structural unit, $R_{25}$ is —H and in another structural unit, $R_{25}$ is —COOH.

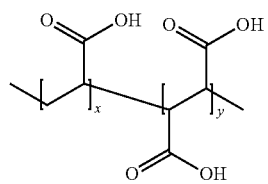

It is described for clarity that the substrate cleaning solution according to the present invention may comprise one or more of the above-described preferred examples in combination as the soluble solute (B). For example, the soluble solute (B) may comprise both 2,2-bis(4-hydroxyphenyl)propane and 3,6-dimethyl-4-octin-3,6-diol.

In one embodiment of the present invention, the molecular weight of the soluble solute (B) is 80-10,000, preferably 90-5,000, and more preferably 100-3,000. When the soluble solute (B) is resin or polymer, the molecular weight represents weight-average molecular weight ($M_w$).

The soluble solute (B) can be obtained even by either synthesizing or purchasing. As a supplier, Sigma-Aldrich, Tokyo Chemical Industry Co., Ltd. and Nippon Shokubai Co., Ltd. are mentioned.

In one embodiment of the present invention, the content of the soluble solute (B) is preferably 1-100 mass %, more preferably 1-50 mass %, and further preferably 1-30 mass %, based on the total mass of the insoluble or hardly soluble solute (A) in the substrate cleaning solution.

<Solvent>

The substrate cleaning solution according to the present invention comprises a solvent (C). Preferably, the solvent (C) comprises an organic solvent. As one embodiment of the present invention, the solvent (C) has volatility. Having volatility means to have higher volatility compared with water. For example, the boiling point of the solvent (C) at one atmospheric pressure is preferably 50-250° C., more preferably 50-200° C., further preferably 60-170° C., and still more preferably 70-150° C. It is also accepted that the solvent (C) contains a small amount of pure water. The content of the pure water contained in the solvent (C) is preferably 30 mass % or less, more preferably 20 mass % or less, and further preferably 10 mass % or less, and still more preferably 5 mass %, based on the total mass of the solvent (C). Containing no pure water (0 mass %) is also a preferred embodiment of the present invention. In the present specification, pure water is preferably DIW.

The organic solvents include alcohols such as isopropanol (IPA); ethylene glycol monoalkyl ethers such as ethylene glycol monomethyl ether and ethylene glycol monoethyl ether; ethylene glycol mono alkyl ether acetates such as ethylene glycol monomethyl ether acetate and ethylene glycol monoethyl ether acetate; propylene glycol monoalkyl ethers such as propylene glycol monomethyl ether (PGME), propylene glycol monoethyl ether (PGEE); propylene glycol monoalkyl ether acetates such as propylene glycol monomethyl ether acetate (PGMEA) and propylene glycol monoethyl ether acetate; lactic acid esters such as methyl lactate and ethyl lactate (EL); aromatic hydrocarbons such as toluene and xylene; ketones such as methyl ethyl ketone, 2-heptanone and cyclohexanone; amides such as N,N-dimethylacetamide and N-methyl pyrrolidone; and lactones such as γ-butyrolactone. These organic solvents can be used alone or in any combination of any two or more of these.

In a preferred embodiment, the organic solvent contained in the solvent (C) is selected from IPA, PGME, PGEE, EL, PGMEA, and any combination of any of these. When the organic solvent is a combination of two, the volume ratio is preferably 20:80-80:20, and more preferably 30:70-70:30.

In one embodiment of the present invention, the content of the solvent (C) is 0.1-99.9 mass %, preferably 50-99.9 mass %, more preferably 75-99.5 mass %, further preferably 80-99 mass %, and still more preferably 85-99 mass %, based on the total mass of the substrate cleaning solution.

<Alkali Component>

The substrate cleaning solution according to the present invention may further comprise an alkali component. In one embodiment of the present invention, the alkaline component comprises at least one of primary amine, secondary amine, tertiary amine and quaternary ammonium salt (preferably primary amine, secondary amine and tertiary amine), and the alkaline component comprises a hydrocarbon. In a preferred embodiment, the alkaline component remains in a film that has been formed from the substrate cleaning solution, and the alkaline component dissolves in a remover when the remover peels off the film. For that, the boiling point of the alkali component at one atmospheric pressure is preferably 20-400° C., more preferably 115-350° C., and further preferably 200-350° C.

By adding an alkali component to the substrate cleaning solution of the present invention, it is expected that the film can be removed even without using a liquid having a high pH for the remover. For example, it is expected that pure water or a weakly acidic solution can be used as the remover. At the same time, it is also expected to reduce the damage to the substrate.

Although there is no intention to limit the present invention, preferred examples of the alkali component include N-benzylethanolamine, diethanolamine, monoethanolamine, 2-(2-aminoethylamino)ethanol, 4,4'-diaminodiphenylmethane, 2-(butylamino)ethanol, 2-anilinoethanol, triethanolamine, ethylenediamine, diethylenetriamine, tris(2-aminoethyl)amine, tris[2-(dimethylamino)ethyl]amine, N,N,N',N'-tetrakis(2-hydroxyethyl)ethylenediannine, N,N,N',N'-tetraethylethylenediamine, 1,4-diazabicyclo[2.2.2]octane, hexamethylenetetramine, 1,4,7,10-tetraazacyclododecane, and 1,4,7,10,13,16-hexaazacycloalkyloctadecane.

The molecular weight of the alkali component is preferably 50-500, and more preferably 80-300.

The alkaline component can be obtained even by either synthesizing or purchasing. As a supplier, Sigma-Aldrich and Tokyo Chemical Industry Co., Ltd. are mentioned.

In one embodiment of the present invention, the content of the alkali component is preferably 1-100 mass %, more preferably 1-50 mass %, and further preferably 1-30 mass %, based on the total mass of the insoluble or hardly soluble solute (A) in the substrate cleaning solution.

<Further Additive>

The substrate cleaning solution of the present invention may additionally comprise a further additive (D). In one embodiment of the present invention, the further additive (D) comprises a surfactant, an acid, a base, an antibacterial agent, a germicide, an antiseptic or an antifungal agent (preferably, a surfactant), and it may comprise any combination of any of these.

In one embodiment of the present invention, the content of the further additive (D) (in the case of plural, the sum thereof) is 0-100 mass % (preferably 0-10 mass %, more preferably 0-5 mass %, further preferably 0-3 mass %, and still more preferably 0-1 mass %), based on the total mass of the insoluble or hardly soluble solute (A) in the substrate cleaning solution. Containing no further additive (0 mass %) is also a preferred embodiment of the present invention.

<Remover>

As described above, the substrate cleaning solution of the present invention is dripped on a substrate and dried to remove the solvent (C), and filmed insoluble or hardly soluble solute (A) together with the soluble solute (B) remains in the film on the substrate, the film being the removed from the substrate by a remover. The film is capable of holding particles present on the substrate, and it is a preferred embodiment of the present invention that the film is removed by the remover while holding.

The remover may be alkaline, neutral or acidic, but is preferably alkaline. In one embodiment of the present invention, pH of the remover is 7-13 (preferably 8-13, more preferably 10-13, and still more preferably 11-12.5). The measurement of pH is preferably carried out after being degassed, to avoid the influence of the dissolution of carbon dioxide gas in the air.

Although there is no intention to limit the present invention, exemplified examples of the remover include ammonia water, SC-1 cleaning solution, aqueous TMAH solution, aqueous choline solution, and any combination of any of these (preferably ammonia water). In one embodiment of the present invention, most of the solvent in the remover is pure water, and the ratio of pure water to the solvent is 50-100 mass % (preferably 70-100 mass %, more preferably 90-100 mass %, further preferably 95-100 mass %, and still more preferably 99 100 mass %). In one embodiment of the present invention, the concentration of the solute in the remover is 0.1-10 mass % (preferably 0.2-8 mass %, and more preferably 0.3-6 mass %). By adding the above-mentioned alkali component in the substrate cleaning solution, it is also possible to use pure water (concentration of solute: 0.0 mass %, and preferably 0.00 mass %) as the remover.

Although this is not intended to limit the scope of the invention and not to be bound by theory, a state of cleaning the substrate according to the present invention is described using a schematic FIGURE for the understanding of the present invention.

The substrate cleaning solution used in the embodiment of FIG. 1 is composed of an insoluble or hardly soluble solute (A), a crack accelerating component (B') and a solvent (C). (a) shows a state in which particles 2 are attached to the substrate 1. The substrate cleaning solution of the present invention is dripped on this substrate and dried, and the state in which the insoluble or hardly soluble solute (A) forms a film (b) is shown by (b). In (b), the film becomes a particle holding layer 3. The crack accelerating component 4 is present in the particle holding layer 3. Thereafter, the remover 5 is applied on the film, and the state in which the crack accelerating component 4 has dissolved in the remover 5 is shown by (c). Through such a dissolvement, traces 6 due to the elution of the crack accelerating component in the particle holding layer 3 are generated. The traces 6 promote the action of the film's peeling and being removed from the substrate. The state in which the cracks 7 grow from the traces 6 is shown by (d). The state in which the film parted by the growth of the cracks 7 is removed from the substrate while holding particles is shown by (e). The state of the substrate obtained by being cleaned is shown by (f).

<Cleaning of Substrate>

The substrate cleaning solution of the present invention can be used to clean a substrate. For the cleaning of a substrate, a known method or an apparatus (for example, described in JP-A 2018-110220) can be used. The present invention provides a method for manufacturing a cleaned substrate as one embodiment.

The method for cleaning a substrate is described below using a more particular embodiment. In the following, numbers in parentheses indicate the order of steps. For example, when the steps (0-1), (0-2) and (1) are described, the order of the steps is as described above.

The substrate cleaning preferably comprises:
(1) dripping the substrate cleaning solution of the present invention on a substrate;
(2) removing the solvent (C), and filmed insoluble or hardly soluble solute (A) together with the soluble solute (B) remains in the film on the substrate;
(3) making the film hold particles on the substrate; and
(4) applying a remover on the substrate to remove the film in which particles are held.

The above (1) is carried out by dripping the substrate cleaning solution nearly at the center of the horizontally postured substrate through a nozzle or the like in an apparatus suitable for substrate cleaning. The dripping may be in the form of liquid column or dropping. At the time of the dripping, the substrate is rotated, for example, at 10 to several tens of rpm, so that the generation of dripping traces can be suppressed.

The dripping amount is preferably 0.5-10 cc. These conditions can be adjusted so that the substrate cleaning solution is uniformly applied and spread.

The removal of the solvent (C) described in the above (2) is carried out by drying, preferably by spin-drying. The spin-dry is carried out at 500-3,000 rpm (more preferably 500-1,500 rpm, and further preferably 500-1,000 rpm) for preferably 0.5-90 seconds (more preferably 5-80 seconds, further preferably 15-70 seconds, and still more preferably 30-60 seconds). Accordingly, the solvent (C) can be dried while spreading the substrate cleaning solution over the entire surface of the substrate. Preferably, the substrate is a disk shape substrate having a diameter of 200-600 nm (more preferably 200-400 mm).

Making the film hold particles on the substrate referred in the above (3) means it is carried out by removing the solvent (C) referred in the above (2), whereby the insoluble or hardly soluble solute (A) forms a film and holds particles. That is, it can be said also that the above steps (2) and (3) occur continuously by one operation. Here, the removal of the solvent (C) referred in the above (2) accepts a state in which the solvent (C) slightly remains in the film. In one embodiment of the present invention, 95% or more (preferably 98% or more, and more preferably 99% or more) of the solvent (C) is volatilized at the end of the above steps (2) and (3) and does not remain in the film.

The above steps (2) and/or (3) may be carried out while raising the temperature in the apparatus. It can be expected that raising of the temperature promotes the volatilization of the solvent (C) and the film formation of solid components such as the insoluble or hardly soluble solute (A). When the temperature is raised, it is preferably 40-150° C.

In the above (4), a remover is applied on the substrate to remove the film in which particles are held (particle holding layer). The application can be performed by dripping, spraying or dipping. The dripping may be performed so as to form a liquid pool (paddle) on the substrate or may be dripped continuously. In one embodiment of the present invention, the remover is dripped at the center of the substrate while the substrate is rotating at 500-800 rpm.

When the remover (F) removes (for example, peels off) the particle holding layer, it is considered that the soluble solute (B) remained in the film generates a portion to become a trigger that the film peels. Accordingly, it is preferable that the soluble solute (B) has a higher solubility in the remover than the insoluble or hardly soluble solute (A).

It is a preferable embodiment of the present invention that the particle holding layer is removed from the substrate while holding particles without being completely dissolved by the remover. The particle holding layer is considered to be removed by, for example, becoming in a state of being finely cut by the "portion to become a trigger that the film peels".

In the method for cleaning a substrate according to the present invention, an embodiment additionally including at least one steps other than the above is also preferable. Such processes include those known in the substrate cleaning. For example, the following steps may be mentioned.

(0-1) A Step of Processing the Substrate by Etching to Form a Pattern and Removing an Etching Mask The substrate to be cleaned may be a processed substrate, and the processing may be performed by a lithography technique.

(0-2) A Step of Cleaning the Substrate

In order to reduce the number of particles on the substrate, the substrate may be cleaned with a known cleaning solution (such as a rinse solution). It is one of the objects of the present invention to remove a few particles that remain even by this.

(0-3) A Step of Prewetting the Substrate

It is also a preferred embodiment to prewet the substrate in order to improve the coatability of the substrate cleaning solution of the present invention and spread it uniformly on the substrate. Preferably, the liquid used for prewetting (prewetting solution) includes IPA, PGME, PGMEA, PGEE, n-butanol (nBA), pure water, and any combination of any of these.

(0-4) A step of cleaning the substrate

In order to replace the prewetting solution referred in the above (0-3), a step of cleaning the substrate is also a preferred embodiment. It is an embodiment of the present invention to make the step (0-4) unneeded by inserting the step (0-2).

(3-1) A Step of Applying a Liquid on the Particle Holding Layer

It is also possible to include a step of applying a liquid different from the remover after the step (3) in order to enhance the hydrophilicity or hydrophobicity (preferably hydrophilicity) of the particle holding layer. It is preferable that the liquid has a weaker power to dissolve the solid component of the particle holding layer than the remover. The process (3-1) may be omitted.

(5) A Step of Dripping Pure Water or an Organic Solvent on the Substrate after the Removal of the Film in which Particles are Held and Removing Pure Water or the Organic Solvent to Clean the Substrate Further It is also a preferred embodiment to further clean the substrate with pure water or an organic solvent (preferably an organic solvent) in order to remove local film residue and particles residue. The organic solvent includes IPA, PGME, PGMEA, PGEE, nBA, and any combination of at least two of these.

(6) A Step of Drying the Substrate

The means for drying the substrate include spin drying, supplying dry gas (such as spraying), reduced pressure, heating, and any combination of any of these.

<Substrate>

The substrate to be cleaned in the present invention include semiconductor wafers, glass substrates for liquid crystal display, glass substrates for organic EL display, glass substrates for plasma display, substrates for optical disk, substrates for magnetic disk, substrates for magneto-optical disk, glass substrates for photomask, substrates for solar cell, and the like. The substrate may be a non-processed substrate (for example, a bare wafer) or a processed substrate (for example, a patterned substrate). The substrate may be composed by laminating a plurality of layers. Preferably, the surface of the substrate is a semiconductor. The semiconductor may be composed of oxide, nitride, metal, and any combination of any of these. Further, the surface of the substrate is preferably selected from the group consisting of Si, Ge, SiGe, $Si_3N_4$, TaN, $SiO_2$, $TiO_2$, $Al_2O_3$, SiON, $HfO_2$, $T_2O_5$, $HfSiO_4$, $Y_2O_3$, GaN, TiN, TaN, $Si_3N_4$, NbN, Cu, Ta, W, Hf, Al.

<Device>

By further processing the substrate manufactured by the cleaning method according to the present invention, a device can be manufactured. Examples of the device include semiconductors, liquid crystal display devices, organic EL display devices, plasma display devices, and solar cell devices. A known method can be used for processing these. After device formation, if desired, the substrate can be cut into chips, connected to lead frame, and packaged with resin. One example of this packaged product is a semiconductor.

The present invention is described below with reference to examples. In addition, the embodiment of the present invention is not limited only to these examples.

Preparation of Patterned Substrate

A KrF resist composition (AZ DX-6270P, Merck Performance Materials K.K., hereinafter referred to as MPM) is dripped on an 8-inch Si substrate, and spin-coated on the substrate at 1500 rpm. The substrate is soft-baked at 120° C. for 90 seconds. The resultant is exposed using KrF stepper (FPA-3000 EXS, Canon Inc.) with 20 mJ/cm$^2$, subjected to PEB (post exposure bake) for 90 seconds at 130° C. and developed with a developer (AZ MIF-300, MPM). Thereby, a line-and-space resist pattern having a pitch of 360 nm and a duty ratio of 1:1 is obtained. The substrate is etched with a dry etching apparatus (NE-5000N, ULVAC Inc.) using the resist pattern as an etching mask. Thereafter, the substrate is cleaned with a stripper (AZ 400T, MPM), and the resist pattern and the resist residue are peeled off. Thereby, a patterned substrate having a pattern with a pitch of 360 nm, a duty ratio of 1:1, and a line height of 150 nm is produced.

Preparation of Bare Substrate

An 8-inch Si substrate is used.

Adjustment of Evaluation Substrate

Particles are attached to the patterned substrate and the bare substrate described above.

Ultra-high purity colloidal silica (PL-10H, Fuso Chemical Industry Co., Ltd., average primary particle size: 90 nm) is used as particles for experiment. 50 mL of the silica fine particle composition is dripped and applied by rotating at 500 rpm for 5 seconds. Thereafter, the solvent of the silica fine particle composition is spin-dried by rotating at 1000 rpm for 30 seconds. Thereby, an evaluation substrate is obtained.

Evaluation of Solubility 4 mg of each component (for example, 2,2-bis (4-hydroxyphenyl) propane) to be used thereafter is put in a 50 mL sample bottle, and 5.0 mass % ammonia water is added to make the total amount to 40 g. Covering this with a cap, it is shaken and stirred for 3 hours. This gives a liquid having a component concentration of 100 ppm.

The same procedure as described above is carried out except that the amount of each component added is changed to 40 mg, and a liquid having a component concentration of 1,000 ppm is obtained. Their solubility is checked visually. Evaluation criteria are as shown below.

X: When the dissolution residue is confirmed at 100 ppm and 1,000 ppm, it is judged to be insoluble or hardly soluble.

Y: When the dissolution residue is not confirmed at 100 ppm but confirmed at 1,000 ppm, it is judged to be slightly soluble.

Z: When the dissolution residue is confirmed at neither 100 ppm nor 1,000 ppm, it is judged to be soluble.

The evaluation results are indicated in Table 1 below.

Preparation Example 1 of Cleaning Solution 1

Novolak ($M_w$: about 300) as the insoluble or hardly soluble solute (A) and 2,2-bis(4-hydroxyphenyl) propane as the soluble solute (B) are used.

2,2-bis(4-hydroxyphenyl)propane is weighed so as to become 5 mass % based on novolac (Mw: about 300). Taking these so as to become 5 g in total and they are added to 95 g of IPA (solvent (C)). The resultant is stirred with a stirrer for 1 hour to obtain a solution having a solid component concentration of 5 mass %.

This solution is filtered with Optimizer UPE (UPE, Nippon Entegris K.K., pore diameter: 10 nm). Thereby, Cleaning Solution 1 is obtained. This is indicated in Table 1.

In Table 1 below, the number in parentheses in column (B) means the concentration (mass %) of the soluble solute (B) compared with the insoluble or hardly soluble solute (A).

TABLE 1

| | (A) | | (B) | | (C) | Solid component concentration | Removal Evaluation Patterned substrate | Bare substrate |
|---|---|---|---|---|---|---|---|---|
| | Component | Solubility | Component | Solubility | | | | |
| Cleaning Solution 1 | A1 | X | B1 (5%) | Y | IPA | 5% | A | A |
| Cleaning Solution 2 | A2 | X | B1 (5%) | Y | IPA | 5% | AA | A |
| Cleaning Solution 3 | A3 | X | B1 (5%) | Y | IPA | 5% | AA | AA |
| Cleaning Solution 4 | A4 | X | B1 (5%) | Y | IPA | 5% | AA | AA |
| Cleaning Solution 5 | A5 | X | B1 (5%) | Y | IPA | 5% | A | AA |
| Cleaning Solution 6 | A6 | X | B1 (5%) | Y | IPA | 5% | A | A |
| Cleaning Solution 7 | A7 | X | B1 (5%) | Y | PGME | 5% | AA | AA |
| Cleaning Solution 8 | A8 | X | B1 (5%) | Y | PGME | 5% | AA | AA |
| Cleaning Solution 9 | A9 | X | B1 (5%) | Y | PGME | 5% | AA | AA |
| Cleaning Solution 10 | A10 | X | B1 (5%) | Y | PGME | 5% | AA | AA |
| Cleaning Solution 11 | A11 | X | B1 (5%) | Y | PGME | 5% | AA | AA |
| Cleaning Solution 12 | A12 | X | B1 (0.10%) | Y | IPA:PGME = 1:1 | 5% | A | A |
| Cleaning Solution 13 | A12 | X | B1 (1%) | Y | IPA:PGME = 1:1 | 5% | AA | AA |
| Cleaning Solution 14 | A12 | X | B1 (5%) | Y | IPA:PGME = 1:1 | 5% | AA | AA |
| Cleaning Solution 15 | A12 | X | B1 (10%) | Y | IPA:PGME = 1:1 | 5% | AA | AA |
| Cleaning Solution 16 | A12 | X | B1 (50%) | Y | IPA:PGME = 1:1 | 5% | AA | AA |
| Cleaning Solution 17 | A12 | X | B1 (100%) | Y | IPA:PGME = 1:1 | 5% | A | A |
| Cleaning Solution 18 | A12 | X | B1 (5%) | Y | IPA:PGEE = 1:1 | 0.10% | A | A |
| Cleaning Solution 19 | A12 | X | B1 (5%) | Y | IPA:PGEE = 1:1 | 1% | AA | A |
| Cleaning Solution 20 | A12 | X | B1 (5%) | Y | IPA:PGEE = 1:1 | 10% | AA | AA |
| Cleaning Solution 21 | A12 | X | B1 (5%) | Y | IPA:PGEE = 1:1 | 30% | AA | A |
| Cleaning Solution 22 | A12 | X | B1 (5%) | Y | IPA:PGEE = 1:1 | 50% | AA | A |
| Cleaning Solution 23 | A12 | X | B2 (5%) | Z | PGEE | 5% | A | AA |
| Cleaning Solution 24 | A12 | X | B3 (5%) | Z | PGEE | 5% | A | AA |
| Cleaning Solution 25 | A12 | X | B4 (5%) | Y | PGEE | 5% | AA | AA |
| Cleaning Solution 26 | A12 | X | B5 (5%) | Z | PGEE | 5% | AA | AA |
| Cleaning Solution 27 | A12 | X | B6 (5%) | Y | PGEE | 5% | AA | AA |
| Cleaning Solution 28 | A12 | X | B7 (5%) | Y | EL | 5% | AA | AA |
| Cleaning Solution 29 | A12 | X | B8 (5%) | Z | EL | 5% | AA | AA |
| Cleaning Solution 30 | A12 | X | B9 (5%) | Z | EL | 5% | AA | AA |
| Cleaning Solution 31 | A12 | X | B10 (5%) | Z | EL | 5% | AA | AA |
| Cleaning Solution 32 | A12 | X | B11 (5%) | Z | IPA:DIW = 1:2 | 5% | AA | A |
| Cleaning Solution 33 | A12 | X | B12 (5%) | Z | IPA:DIW = 1:2 | 5% | AA | A |
| Comparative Cleaning Solution 1 | A12 | X | — | — | IPA | 5% | B | D |
| Comparative Cleaning Solution 2 | — | — | B4 | Y | IPA | 5% | C | C |
| Comparative Cleaning Solution 3 | A12 | X | B13 (5%) | X | IPA | 5% | D | D |
| Comparative Cleaning Solution 4 | A13 | Z | B11 (5%) | Z | IPA:DIW = 1:2 | 5% | B | B |
| Comparative Cleaning Solution 5 | A14 | Z | B11 (5%) | Z | IPA:DIW = 1:2 | 5% | C | C |
| Comparative Cleaning Solution 6 | A15 | Z | B3 (5%) | Z | IPA:DIW = 1:2 | 5% | C | C |
| Comparative Cleaning Solution 7 | A16 | Z | B3 (5%) | Z | IPA:DIW = 1:2 | 5% | C | C |

In the above table, the followings are abbreviated as follows:

novolak (Mw: about 300): A1,
novolak (Mw: about 500): A2,
novolak (Mw: about 1,000): A3,
novolak (Mw: about 10,000): A4,
novolak (Mw: about 100,000): A5,
novolak (Mw: about 500,000): A6,
phenol novolak (Mw: about 5,000): A7,
polyhydroxystyrene (Mw: about 5,000): A8,
butyl polyacrylate having a structure shown below (Mw: about 60,000, Sigma-Aldrich): A9,

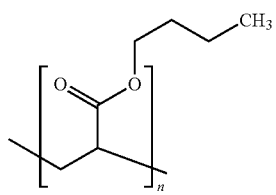

polycarbonate (Mw: about 5,000): A10,
4,4'-dihydroxytetraphenylmethane (Mw: 352): A11,
novolak (Mw: about 5,000): A12,
polyfluoroalkyl acid (TAR-015, Daikin Industries, Ltd.): A13, KF-351A (Si-containing polyether modified polymer, Shin-Etsu Silicone Co., Ltd.): A14,
polyvinylimidazole (Mw: about 5,000): A15,
polyallylamine (Mw: about 5,000): A16,
2,2-bis(4-hydroxyphenyl)propane: B1,
1,2,2,2-tetrakis(4-hydroxyphenyl)ethane: B2,
1,3-cyclohexanediol: B3,
2,6-bis[(2-hydroxy-5-methylphenyl)methyl]-4-methylphenol: B4,
2,2'-methylenebis(4-methylphenol): B5,
4,4'-dihydroxybiphenyl: B6,
2,6-naphthalenediol: B7,
2,5-dimethyl-3-hexyne-2,5-diol: B8,
3,6-dimethyl-4-octin-3,6-diol: B9,
2,5-di-tert-butylhydroquinone: B10,
polyacrylic acid (Mw: about 1,000): B11,
copolymer of maleic acid and acrylic acid having a structure shown below (Mw: about 3,000): B12,

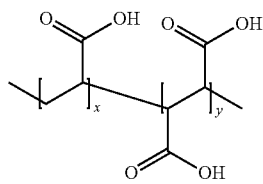

novolak (Mw: about 15,000): B13

Comparative Preparation Example 1 of Comparative Cleaning Solution 1

Comparative Cleaning Solution 1 is obtained by carrying out the preparation in the same manner as in Preparation Example 1 except that 5 g of A12 is taken and added to 95 g of IPA (solvent (C)). This is indicated in Table 1.

Comparative Preparation Example 2 of Comparative Cleaning Solution 2

Comparative Cleaning Solution 2 is obtained by carrying out the preparation in the same manner as in Preparation Example 1 except that 5 g of B4 is taken and added to 95 g of IPA (solvent (C)). This is indicated in Table 1.

Preparation Examples 2-33 of Cleaning Solutions 2-33 and Comparative Preparation Examples 3-7 of Comparative Cleaning Solutions 3-7

Cleaning Solutions 2-33 and Comparative Cleaning Solutions 3-7 are prepared in the same manner as in Preparation Example 1 except that the insoluble or hardly soluble solute (A), the soluble solute (B), the solvent (C), and the concentration are changed to those indicated in Table 1. This is indicated in Table 1.
Evaluation of Residual Amount of Particles for Cleaning Solutions 1-33 and Comparative Cleaning Solutions 1-7

Evaluation substrates prepared as described in the above-mentioned preparation of the evaluation substrate are used.

Using Coater/Developer RF 3 (SOKUDO Co., Ltd.), 10 cc of each substrate cleaning solution is dripped on each evaluation substrate, and coating and drying are performed by rotating at 1,500 rpm for 60 seconds. While rotating the substrate at 100 rpm, 5.0 mass % ammonia water is dripped for 10 seconds, the whole substrate is covered with 5.0 mass % ammonia water, and this state is maintained for 20 seconds. By rotating the substrate at 1,500 rpm, the film is peeled off and removed to dry the substrate.

The amounts of residual particles on these substrates are compared. A bright field defect inspection system (UVision 4, Applied Materials Inc.) is used for the evaluation of the patterned substrate, and a dark field defect inspection system (LS-9110, Hitachi High-Technologies Corporation) is used for the evaluation of the bare substrate.

The state of application and the state of film removal are confirmed, the number of residual particles is counted and evaluated according to the following criteria. The evaluation results are indicated in Table 1.
AA: ≤10 pieces
A: >10 pieces, ≤100 pieces
B: >100 pieces, ≤1,000 pieces
C: >1,000 pieces
D: film is not uniformly applied, or film is not removed
Comparative Cleaning Solutions 1-7 do not contain a plurality of components having different solubilities. It is confirmed that compared with Comparative Cleaning Solutions 1-7, the substrate cleaned with Cleaning Solutions 1-33 has less amount of residual particles.

EXPLANATION OF SYMBOLS 1. substrate
2. particle
3. particle holding layer
4. crack accelerating component
5. remover
6. trace of elution of crack accelerating component
7. crack

The invention claimed is:
1. A method for manufacturing a cleaned substrate, comprising:
   (1) dripping a cleaning solution on a substrate to form a film and wherein the cleaning solution comprising an insoluble or hardly soluble solute (A); a soluble solute (B), and a solvent (C);
   (2) removing the solvent (C), and filmed insoluble or hardly soluble solute (A) together with the soluble solute (B) remains in the film on the substrate;
   (3) making the film hold particles on the substrate; and
   (4) applying a remover on the substrate to remove the film holding particles
   wherein insoluble or hardly soluble solute (A) has a solubility of less than 100 ppm and wherein the soluble solute (B) is represented by the formula (B-1), (B-2) or (B-3)
   (B-1) a compound comprising 1 to 6 structural units, wherein the structural unit is represented by the formula (B-1)' and each structural unit is bonded via a linker

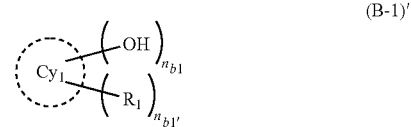

where
L₁ is selected from at least one of a single bond and $C_{1-6}$ alkylene,
$Cy_1$ is a $C_{5-30}$ hydrocarbon ring,
$R_1$ is each independently $C_{1-5}$ alkyl, $n_{b1}$ is 1, 2, or 3,
$n_{b1'}$ is 0, 1, 2, 3, or 4;

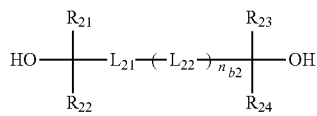
(B-2)

wherein, $R_{21}$, $R_{22}$, $R_{23}$, and $R_{24}$ are each independently hydrogen or a $C_{1-5}$ alkyl, $L_{21}$ and $L_{22}$ are each independently a $C_{1-20}$ alkylene, a $C_{1-20}$ cycloalkylene, a $C_{2-4}$ alkenylene, a $C_{2-4}$ alkynylene, or a $C_{6-20}$ arylene, where these groups may be substituted by a $C_{1-5}$ alkyl or hydroxy, $n_{b2}$ is 0, 1, or 2; and (B-3) a polymer comprising a structural unit represented by the formula (B-3)' and having a weight-average molecular weight ($M_w$) of 500-10,000,

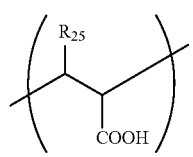
(B-3)' wherein $R_{25}$ is —H, —$CH_3$, or —COOH.

2. The method for manufacturing a cleaned substrate according to claim 1, wherein the insoluble or hardly soluble solute (A) is insoluble or hardly insoluble in the remover; and the soluble solute (B) is soluble in the remover.

3. The method for manufacturing a cleaned substrate according to claim 1, the solvent (C) comprises an organic solvent, and the solvent (C) has volatility; and the solvent (C) has a boiling point at one atmospheric pressure is 50-250° C.

4. The method for manufacturing a cleaned substrate according to claim 1, wherein the insoluble or hardly soluble solute (A) comprises at least one of novolak, polyhydroxy styrene, polystyrene, polyacrylate derivatives, polymaleic acid derivatives, polycarbonate, polyvinyl alcohol derivatives, polymethacrylate derivatives, and copolymer of any combination of any of these, and the insoluble or hardly soluble solute (A) does not contain fluorine and/or silicon.

5. The method for manufacturing a cleaned substrate according to claim 1, wherein the soluble solute (B) is a crack accelerating component (B'), where the crack accelerating component (B') comprises hydrocarbon and further comprises a hydroxy group and/or a carbonyl group.

6. The method for manufacturing a cleaned substrate according to claim 1, wherein the insoluble or hardly soluble solute (A) has a solubility in 5.0 mass % ammonia water is less than 100 ppm, and the soluble solute (B) has a solubility in 5.0 mass % ammonia water is 100 ppm or more, and the solubility is determined at 20-35° C. by providing a flask charged with 100 ppm of the (A) or (B) in 5.0 mass % ammonia water, covering the flask with a cap, shaking for 3 hours in a shaker, and confirming whether (A) or (B) is dissolved or not.

7. The method for manufacturing a cleaned substrate according to claim 1, wherein the insoluble or hardly soluble solute (A) has a solubility in 5.0 mass % ammonia water is less than 100 ppm, and the soluble solute (B) has a solubility in 5.0 mass % ammonia water is 100 ppm or more, and the solubility is determined at 25±2° C. by providing a flask charged with 100 ppm of the (A) or (B) in 5.0 mass % ammonia water, covering the flask with a cap, shaking for 3 hours in a shaker, and confirming whether (A) or (B) is dissolved or not.

8. The method for manufacturing a cleaned substrate according to claim 1, wherein the insoluble or hardly soluble solute (A) has a content of 0.1-50 mass % based on a total mass of the substrate cleaning solution, the content of the soluble solute (B) is 1-100 mass % based on the total mass of the insoluble or hardly soluble solute (A); and the content of the solvent (C) is 0.1-99.9 mass % based on the total mass of the substrate cleaning solution.

9. The method for manufacturing a cleaned substrate according to claim 1, wherein the insoluble or hardly soluble solute (A) has a weight-average molecular weight ($M_w$) of is 150-500,000.

10. The method for manufacturing a cleaned substrate according to claim 1, wherein the cleaning solution further comprising a further additive (D), wherein the further additive (D) comprises a surfactant, an acid, a base, an antibacterial agent, a germicide, an antiseptic, or an antifungal agent, and the further additive (D) is present in an amount up to 100 mass % based on a total mass of the insoluble or hardly soluble solute (A).

11. The method for manufacturing a cleaned substrate according to claim 1, wherein the cleaning solution further comprising a further additive (D), wherein the further additive (D) comprises a surfactant, an acid, a base, an antibacterial agent, a germicide, an antiseptic, or an antifungal agent, and the further additive (D) is present in an amount up to 10 mass % based on a total mass of the insoluble or hardly soluble solute (A).

12. The method for manufacturing a cleaned substrate according to claim 1, wherein the substrate in (1) is a non-processed substrate or processed substrate and a surface of the substrate is a semiconductor.

13. The method for manufacturing a cleaned substrate according to claim 1, wherein the substrate in (1) is a non-processed substrate or processed substrate, and a surface of the substrate is a semiconductor, and the surface of the substrate is selected from the group consisting of Si, Ge, SiGe, $Si_3N_4$, TaN, $SiO_2$, $TiO_2$, $Al_2O_3$, SiON, $HfO_2$, $T_2O_5$, $HfSiO_4$, $Y_2O_3$, GaN, TiN, TaN, $Si_3N_4$, NbN, Cu, Ta, W, Hf, and Al.

14. The method for manufacturing a cleaned substrate according to claim 1, comprising at least one of the following steps:

processing the substrate by etching to form a pattern and removing an etching mask;

cleaning the substrate;

prewetting the substrate; and dripping an organic solvent on the substrate after the removal of the film in which particles are held and removing the organic solvent to clean the substrate further.

15. The method for manufacturing a cleaned substrate according to claim 1, wherein the step (2) is carried out by spin-drying the substrate.

16. The method for manufacturing a cleaned substrate according to claim 1, wherein the step (2) is carried out by spin-drying the substrate, and the spin-dry is carried out at 500-3,000 rpm for 0.5-90 seconds and the substrate is a disk shape substrate and has a diameter of 200-600 nm.

17. The method for manufacturing a cleaned substrate according to claim 9, wherein insoluble or hardly soluble solute (A) has a weight-average molecular weight ($M_w$) of the insoluble or hardly soluble solute (A) is 150-500,000, and the molecular weight of the soluble solute (B) is 80-10,000.

* * * * *